United States Patent
Yadav et al.

(10) Patent No.: US 7,295,954 B2
(45) Date of Patent: Nov. 13, 2007

(54) EXPERT KNOWLEDGE METHODS AND SYSTEMS FOR DATA ANALYSIS

(75) Inventors: Puneet Yadav, Fremont, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 596 days.

(21) Appl. No.: 10/327,210

(22) Filed: Dec. 20, 2002

(65) Prior Publication Data

US 2004/0064465 A1 Apr. 1, 2004

Related U.S. Application Data

(60) Provisional application No. 60/414,021, filed on Sep. 26, 2002.

(51) Int. Cl.
G06F 15/00 (2006.01)
(52) U.S. Cl. .......................... 702/190; 703/14
(58) Field of Classification Search .......... 702/57, 702/80, 119–120, 179, 196, 189–190; 703/2–4, 703/14; 706/16, 22–23
See application file for complete search history.

(56) References Cited

U.S. PATENT DOCUMENTS 4,730,259 A * 3/1988 Gallant ................... 706/16
5,446,681 A * 8/1995 Gethner et al. ............. 702/27
6,330,526 B1 12/2001 Yasuda ...................... 703/2
6,368,884 B1 4/2002 Goodwin et al. .......... 438/14
6,988,017 B2 * 1/2006 Pasadyn et al. ........... 700/121

FOREIGN PATENT DOCUMENTS

| EP | 0 932 195 A1 | 7/1999 |
| EP | 1 235 270 A2 | 8/2002 |
| WO | WO 01/80306 A2 | 10/2001 |
| WO | WO 01/80306 A3 | 10/2001 |

* cited by examiner

*Primary Examiner*—Eliseo Ramos-Feliciano
*Assistant Examiner*—Mary Catherine Baran
(74) *Attorney, Agent, or Firm*—Martine Penilla & Gencarella, LLP

(57) ABSTRACT

A method for adjusting a data set defining a set of process runs, each process run having a set of data corresponding to a set of variables for a wafer processing operation is provided. A model derived from a data set is received. A new data set corresponding to one process run is received. The new data set is projected to the model. An outlier data point produced as a result of the projecting is identified. A variable corresponding to the one outlier data point is identified, the identified variable exhibiting a high contribution. A value for the variable from the new data set is identified. Whether the value for the variable is unimportant is determined. A normalized matrix of data is created, using random data and the variable that was determined to be unimportant from each of the new data set and the data set. The data set is updated with the normalized matrix of data.

13 Claims, 5 Drawing Sheets

EXPERT KNOWLEDGE METHODS AND SYSTEMS FOR DATA ANALYSIS

CROSS REFERENCE TO RELATED APPLICATIONS

This application claims priority from U.S. Provisional Patent Application No. 60/414,021 filed on Sep. 26, 2002, and entitled "Method for Quantifying Uniformity Patterns and Including Expert Knowledge for Tool Development and Control," which is incorporated herein by reference in its entirety.

BACKGROUND OF THE INVENTION

1. Field of the Invention

The present invention relates generally to methods for analyzing the performance of wafer process operations run on wafer processing equipment, and more particularly, to methods for identifying variables that cause out-of-statistical-control signals and techniques for incorporating expert knowledge to ascertain the significance of such signals.

2. Description of the Related Art

In an attempt to quantify and study the effects of process conditions during wafer processing, process engineers are tasked with running numerous process runs, each with particularly set variables, and then comprehensively studying results. The set variables, as is well known, are many. For instance, variables can include chamber pressure, chamber temperature, the delivered power to one or both electrodes, electrostatic chuck clamping voltage, types of gases and flow rates, etc. In practice, therefore, data for such variables is measured and recorded as wafers are put through process runs. Databases are created to organize the data for such variables. In the analysis of such data, specific attention is paid to ascertain whether the behavior of particular variables is within an acceptable range.

Multivariate statistical process control tools are available for the monitoring of deviations between historical process runs and new process runs. These tools can statistically define normal operating behavior in a process based on historical data. Statistical projection-based techniques, such as principal component analysis (PCA), are used to produce out-of-statistical-control signals when a variable is identified as deviating out of the bounds of normal operating behavior.

As multivariate statistical process control tools accommodate analysis across a large number of variables the resulting models are very sensitive, too sensitive with respect to some variables.

Another challenge associated with using these techniques is to determine if an out of bounds signal is considered meaningful based on expert knowledge. Some variables or ranges of variable values are more critical than others. For example, once a wafer is clamped into position the clamp voltage could vary, yet still not be considered a fault, or error in the system. Generally, faults are generated when a value for a variable changes so much that it falls out-of-statistical control. So, if a value for clamp voltage is recorded as being out of an acceptable statistical bounds relative to other variables in the system, it may be flagged as a problem and an automatic fault code would be sent out halting the wafer processing.

However an expert observing the same value for clamp voltage might not be concerned with the variable deviation. For example, though the value for clamp voltage is out of the acceptable statistical bounds it could still fall in an operating range where the clamp properly holds the wafer. Unfortunately, a fault would still be registered, even though expert knowledge would deem the out of bounds signal as not warranting a fault. The end result is that reliance on pure mathematical statistical analysis will lead to false fault alarms. Nevertheless, during processing, every fault will generally lead to stoppage of wafer processing operations, thus resulting in wasted time and money.

The models generated in statistical projection-based techniques can be made more robust by incorporating large amounts of data for a particular process and by incorporating detailed information for each variable being recorded. The limitation with this approach is that during the phase when models are being built large amounts of data are not always available for the variables and the cost of experimental operation can be very impractical.

In view of the foregoing, what is needed is a method and system for incorporating expert knowledge in the identification and reduction of false fault alarms in wafer processing systems.

SUMMARY OF THE INVENTION

Broadly speaking, the present invention fills this need by providing a method and system for incorporating expert knowledge for the identification of unimportant out-of-statistical-control signals in wafer processing systems. Several embodiments of the invention are described below.

In one embodiment, a method for adjusting a data set defining a set of process runs, each process run having a set of data corresponding to a set of variables for a wafer processing operation is provided. A model derived from a data set is received. A new data set corresponding to one process run is received. The new data set is projected to the model. An outlier data point produced as a result of the projecting is identified. A variable corresponding to the one outlier data point is identified, the identified variable exhibiting a high contribution. A value for the variable from the new data set is identified. Whether the value for the variable is unimportant is determined. A normalized matrix of data is created, using random data and the variable that was determined to be unimportant from each of the new data set and the data set. The data set is updated with the normalized matrix of data.

In another embodiment, a method for adjusting a data set defining a set of process runs, each process run having a set of data corresponding to a set of variables for a wafer processing operation is provided. A model derived from a data set is received. A new data set is received. The new data set is projected to the model. Outlier data points produced as a result of the projecting are identified. One of the outlier data points from the outlier data points is identified. A variable corresponding to the one outlier data point is identified, the identified variable exhibiting a high contribution. Whether the variable is unimportant is determined. A normalized matrix of data is created, using data from the new data and from the data set, the normalized matrix of data created using the variable that was determined to be unimportant from each of the new data and the data set. The data set is updated with the normalized matrix of data.

In accordance with another aspect of the present invention, a method for updating a data set defining a set of process runs, each process run having a set of data corresponding to a set of variables for a wafer processing operation is provided. A data set is received. Scaling to the data set is performed. Principal component analysis is performed to the scaled data set to generate a model. New data is received. The new data is projected to the model. Outlier data points based on the projecting are identified. A contribution plot corresponding to one of the outlier data points is examined. A variable that corresponds to the one outlier data point which provides a high contribution in the contribution plot is identified. That the variable is unimportant is determined. A desensitizing set of data for the variable is created based on a standard deviation of the data set and a randomization of the new data. The data set is augmented with the desensitizing set of data.

In one embodiment, a method for adjusting a data matrix defining a set of process runs each process run having a set of data corresponding to a set of variables for a wafer processing operation is provided. A data matrix of N rows and M columns where N equals a number of process runs and M equals a number of variables in the data matrix is received. A new set of data with M variables wherein at least one variable corresponds to an outlier and is unimportant based on expert input is received. A normally distributed random vector containing N−1 rows is generated. A one vector containing N−1 rows of ones is generated. A standard deviation of data corresponding to the variable in the data matrix is determined. The standard deviation is multiplied by the normally distributed random vector producing a first vector. The data corresponding to the variable from the new data is multiplied by the one vector producing a second vector. The first vector is added to the second vector producing a third vector. An expert desensitizing matrix is created where the Mth column contains the third vector and the remaining columns are made up of data corresponding to the remaining variables. A new data matrix is created where the data matrix is augmented by the expert desensitizing matrix.

The advantages of the present invention are numerous. One notable benefit and advantage of the invention is that data sets of process runs in wafer process systems can be desensitized incorporating expert knowledge to unimportant variable data by incorporating smaller amounts of data.

Other advantages of the invention will become apparent from the following detailed description, taken in conjunction with the accompanying drawings, illustrating by way of example the principles of the invention.

It is to be understood that the foregoing general description and the following detailed description are exemplary and explanatory only, and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE INVENTION

Several exemplary embodiments of the invention will now be described in detail with reference to the accompanying drawings.

Figure 1:
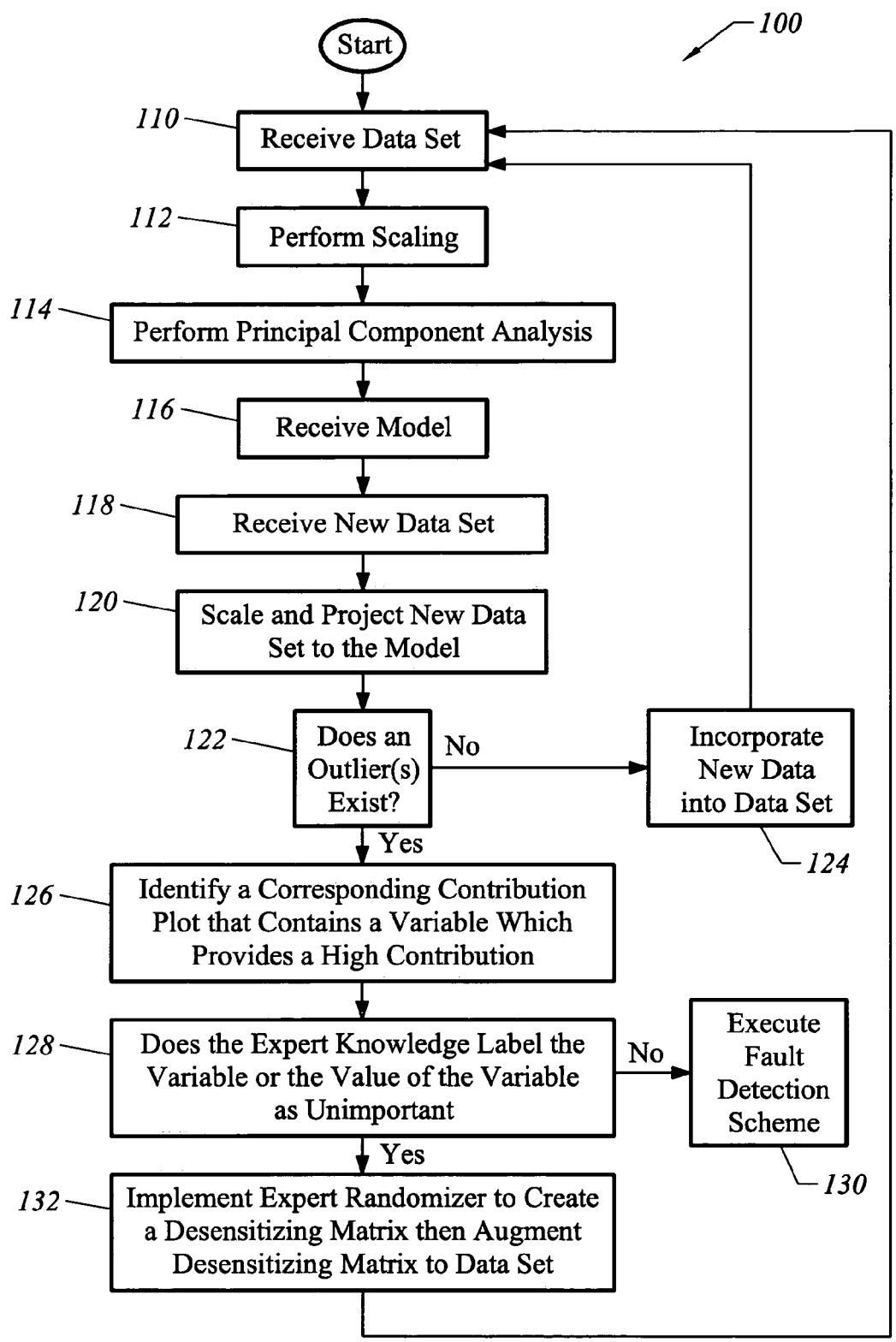
FIG. 1 is a flow chart diagram 100 illustrating the method of operations performed to adjust a data set of process runs for a wafer processing system, in accordance with one embodiment of the invention.

FIG. 1 is a flow chart diagram 100 illustrating the method of operations performed to adjust a data set of process runs for a wafer processing system so as to desensitize the data set to outliers, which are identified as unimportant variable data, in accordance with one embodiment of the invention. The method begins with operation 110 in which a data set is received. For example, in a wafer processing system many parameters or variables are tracked, such as, for example, chamber pressure, chamber temperature, the delivered power to one or both electrodes, electrostatic chuck clamping voltage, types of gases and flow rates, etc. In fact, the variables can include any variable that can be recorded, or gets changed due to an impact of a hardware change or software change. Thus, the variables can represent a range of variables defining changes in a design of equipment used to perform process runs. And, as each of a series of wafers is put through a process run the data for each variable in the wafer processing system is measured and recorded. The data set, in this embodiment, will refer to data corresponding to a set of variables for a series of process runs in a wafer processing system.

Once the data set is received, the method advances to operation 112 in which scaling is performed on the data set. In one embodiment, the data set can be autoscaled such that each variable is in standard units (i.e., has a zero mean and a unit standard deviation) to ensure that the data can be compared across variables with different units. Assuming the data set has been scaled, the method advances to operation 114.

In operation 114 principal component analysis (PCA) is performed on the scaled data set to produce a PCA model and multivariate statistical numbers (such as, for example, Q-residual, $T^2$ residual) of the data set. Multivariate statistical process control is used to define normal operating behavior in a process by statistically analyzing the data from the process. Principal component analysis (PCA) is a statistical projection-based technique, which enables the detection of out-of-statistical-control signals in a process. PCA provides a statistical evaluation of the data set. Modeling methods used for multivariate statistical process control, other than PCA, could be used in this step as well. The PCA performed on the scaled data set will provide a statistical evaluation of the data set that includes a PCA model.

After the principal component analysis has been performed on the scaled data set, the method advances to operation 116. In operation 116 a model is received. The model received is the PCA model which is a result of the PCA operation performed on the data set in operation block 114. Once the model is received, the method advances to operation 118.

In operation 118, a new data set is received. The new data set received in operation 118 is new data corresponding to one process run in a wafer processing system having the same set of variables as the original data set received in operation 110. This method could also be used for a new data set composed of more than one process run. Once the new data set is received, the method advances to operation 120.

In operation 120, the new data set is scaled and projected to the model. In the embodiment shown in FIG. 1, the new data set is scaled using the same mean and standard deviation of the variables of data set before the new data is projected onto the model.

The projection of the new data set to the model will provide a residual plot with corresponding variable contribution plots. These plots will provide statistical information regarding the relationship between the new data set from operation 118 and the data set from operation 110. The residual plot will show if the new data set for the new process run from operation block 118 corresponds to a statistical outlier relative to the multivariate mean, multivariate variation, and a chosen confidence bounds for the data set from operation 110. In this embodiment, the residual plot used is the Q-residual plot. In another embodiment, the residual plot used is the $T^2$ residual plot.

Assuming the new data set has been projected to the model, the method advances to operation 122. In operation 122, the residual plot produced when the new data set was projected to the model is examined to determine if an outlier data point or points exist. For a new data set containing more than one process run, each process run will correspond to a single data point on the residual plot. If the new data set point falls out of an acceptable range of the Q-residual of the data set from operation 110 (i.e., is out of bounds with respect to the model confidence limit), then an outlier exists. Once the determination whether an outlier exists has been made, the operation will proceed to either operation block 124 if an outlier does not exist or to operation block 126 if an outlier does exist.

If an outlier does not exist in the residual plot examined in operation block 122, the method advances to operation 124. In operation 124, the new data set is incorporated with the data set received in operation 110 to create an expanded data set. This expanded data set is then sent to operation block 110 and the method begins again from operation block 110.

If an outlier does exist in the residual plot examined in operation block 122, the method advances to operation block 126. In operation 126, the contribution plot that corresponds to the outlier data point identified in operation 122 is examined for a variable contributor with a high contribution. The residual plot produced after the new data set is projected onto the model in operation 120 will contain one data point for each process run of the new data set. Each data point on the residual plot will then in turn have an associated contribution plot. Each contribution plot will show the relative contribution for each variable's contribution to the Q-Residual. If a variable has a high relative contribution then it is identified as a variable contributor with a high contribution. Whether a contribution is high is a subjective determination. For this example we will assume that there is only one variable contributor with a high contribution. However the contribution plot can have more than one variable contributor and can be accommodated by the method as will be discussed below. Once the contribution plot is examined and a variable is identified as providing a high contribution the method advances to operation block 128.

In operation 128, expert knowledge is used to determine if the variable or the value of the variable identified as providing a high contribution is considered unimportant. Here expert knowledge is information regarding the variables or the value of the variables. An expert is, in this example, an engineer that has extensive knowledge and experience regarding the significance of each variable. Thus, if the variable contributor is determined to be, for example, the wafer clamp voltage variable, the expert might consider this variable to be an unimportant variable.

Furthermore, the expert knowledge might deem a certain range of values for wafer clamp voltage to be acceptable, even if the value is out of acceptable statistical bounds. For example, the wafer clamp voltage could be within engineering specifications. Therefore a fault should not be called in the system based on the given value for the wafer clamp voltage. In this case, the expert knowledge would label a particular range of values for the variable as unimportant. If the value of the variable is considered by the expert knowledge to actually necessitate causing a fault, then after operation block 128 the method will advance to operation block 130. In operation block 130, the detected out of statistical bounds variable will trigger a fault. Alternatively, if the expert knowledge labels the variable or the value of the variable as unimportant, then the method will proceed to operation block 132.

In operation 132, an expert randomizer (ER) will be implemented to create a desensitizing matrix, and then the desensitizing matrix will be augmented to the data set originally received in operation block 110. The expert randomizer implements a method that normalizes the new data corresponding to the variable by using normally distributed random data and the variable data from the data set along with the variable data from the new data. In the embodiment shown in FIG. 1, the data set and the new data set represent the data as received in operation blocks 110 and 118, respectively (i.e., before scaling). The expert randomizer is configured to generate a normally distributed desensitizing matrix using random data and the variable data (i.e., values for the variable being desensitized). The desensitizing matrix is then augmented to the data set received in operation block 110.

The desensitizing matrix will desensitize the data set with respect to the value of the variable in the new data, such that if the same variable data is seen in a subsequent set of new data the same variable data will not cause an outlier in a residual plot when the new data is projected onto the PCA model. Utilizing the teachings of this invention is significantly improved over prior art embodiments that perform trivial desensitization by removing a variable or variables that cause the data to be an outlier from the analysis entirely. This is an important distinction, as the removal of variables eliminates the ability to continue detecting outliers based on those particular variables. According to the teachings of this invention, such outliers can still be detected at levels of deviation above the desensitization level, which is still very valuable.

Figure 6:
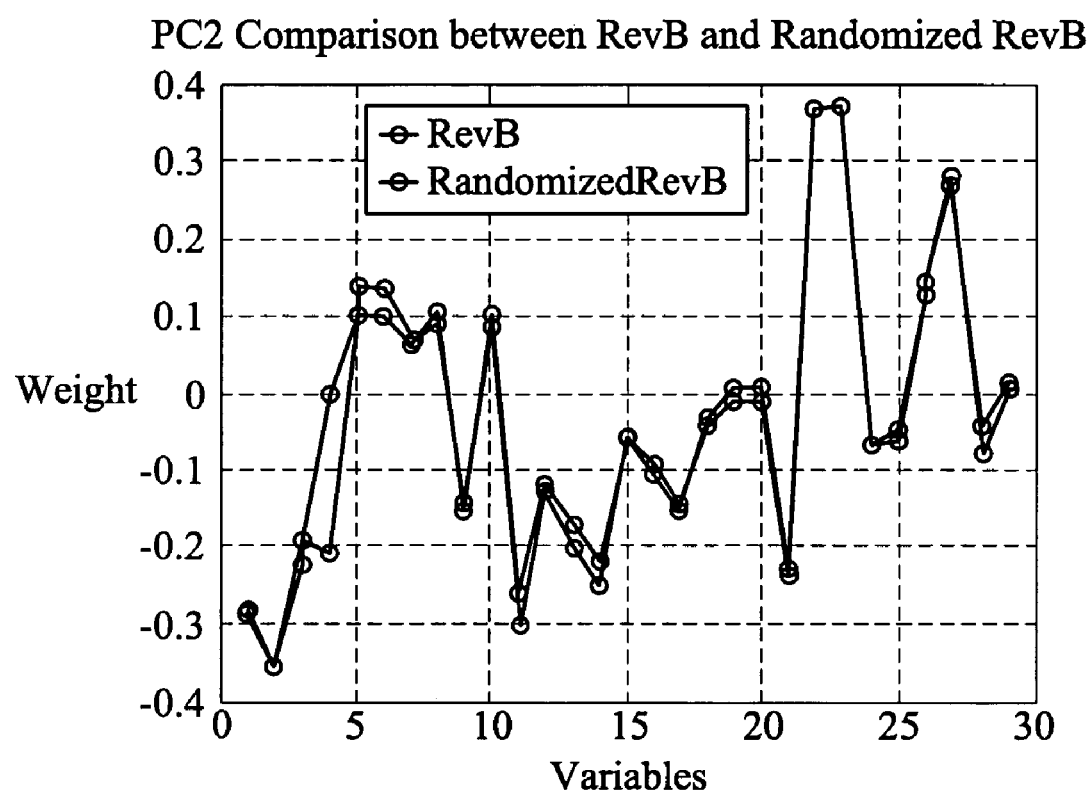
FIG. 6 provides a comparison of the structure of the original model and the model desensitized in accordance with one embodiment of the invention.

One of the strengths of multivariate statistical models for fault detection is the quantification of fault behaviors involving correlated changes amongst the variables. These correlations and their relative sensitivities to variable deviations are referred to as the "structure" of the model which can be visually assessed by comparing the loads of the variables in the model. Another advantage inherent in the methods of this invention is that the model is desensitized to deviations in a variable or variables without destroying the structure of the model, which can be seen in FIG. 6. As a result, the benefits of the original multivariate model are maintained to detect the same types of correlated changes amongst the variables. The expert randomizer is one embodiment of a method to normalize the variable data. More details for the expert randomizer will be provided below.

After the data set originally received in operation block 110 is augmented by the desensitizing matrix, the resulting matrix of data will be sent to operation block 110 to begin the method again if necessary.

An example illustrating the methodology described above as applied to a new data set having more than one process run will be discussed next, with reference to FIG. 2. In this example, the original data, i.e., the data set received in operation block 110, contains 45 samples (i.e., process runs) with 29 variables each. The new data, i.e., the new data set received in operation block 118 contains 44 samples with 29 variables each. Assuming the data set is properly scaled, principal component analysis is performed to create a model. Next, the new data set is projected to the model. After the new data set is projected to the model a residual plot is produced, and from the residual plot it can be determined if one of the 44 process runs represented in the new data has caused an outlier.

Figure 2:
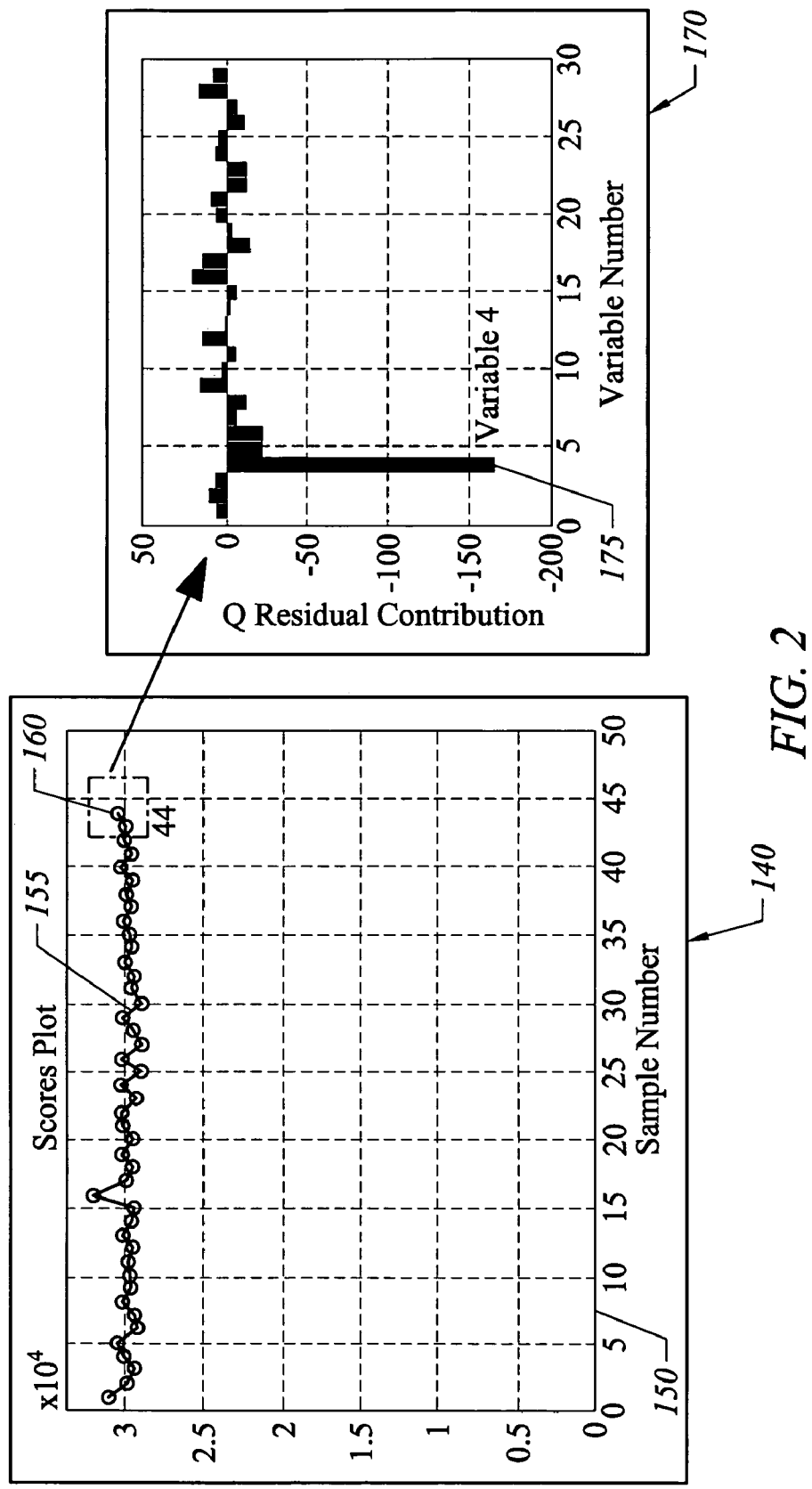
FIG. 2 provides a residual plot and one accompanying variable contribution plot, in accordance with one embodiment of the invention.

As shown in FIG. 2, a residual plot and one accompanying variable contribution plot is provided, in accordance with one embodiment of the invention. As described above, FIG. 2 provides a residual plot 140 associated with projecting a new data set of 44 process runs (with 29 variables each) to a PCA model and a variable contribution plot 170, corresponding to the exemplary 44$^{th}$ process run. The horizontal dashed line 150 intersecting the origin represents the model confidence limit determined from the original data set. The line 155 represented with a line intersecting the circles shown represents the Q residual values for the 44 process runs of the new data. As shown in the residual plot 140, all of the 44 process runs of the new data set are outliers with respect to the data set.

The variable contribution of the exemplary 44$^{th}$ process run is shown in variable contribution plot 170. The relative contribution of variable four (4) 175 is high. For this example there is only one variable with a high contribution, but in other embodiments there could be more than one variable being a high contributor. After variable four has been identified in contribution plot 170 as having a high contribution, expert input will be sought to determine if variable four is unimportant (i.e., if the value for variable four, though causing an outlier, is still acceptable and should not be labeled as a fault). Assuming that variable four is deemed as unimportant based on expert knowledge, the new data set will be normalized. Here, an expert randomizer is used to adjust the new data set. One embodiment of an expert randomizer will be provided in more detail below.

Once the expert randomizer has been applied to create a desensitizing matrix and the data set is augmented with this desensitizing matrix the method can be run again with the augmented data set. If the method is run again with a new data set having the same values as the first new data discussed above, the variable four data will not cause an outlier. The outlier behavior of the variable four data will be desensitized out of the data set. The result of running the method again using the data set augmented with the desensitizing matrix, and introducing a new data set identical to the 44 process run data set used above, will be shown in a side-by-side residual plot.

Figure 3:
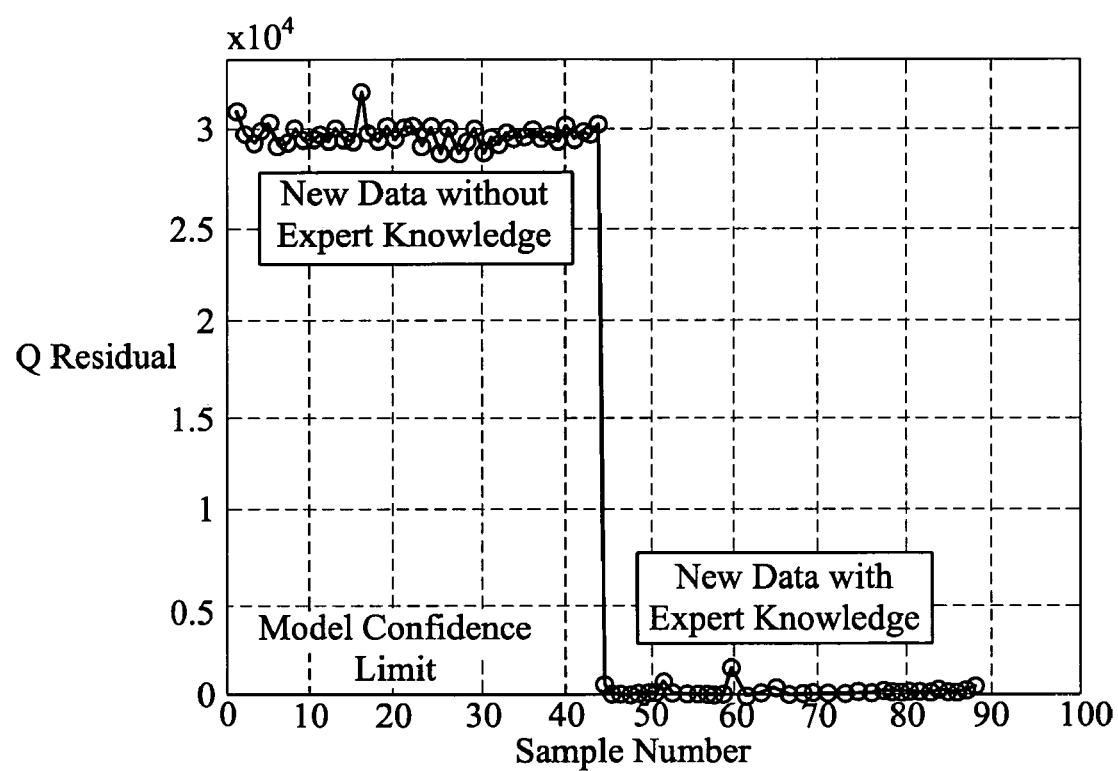
FIG. 3 provides two residual plots, in accordance with one embodiment of the invention.

FIG. 3 provides two residual plots, in accordance with one embodiment of the invention. FIG. 3 provides the residual plot from FIG. 2 at the 0 to 44 sample number side of the graph, where a sample number indicates the process run. The remaining section of the graph provides a residual plot resulting from executing the method a second time. In the second execution of the method the data set has been augmented with the desensitizing matrix and the new data set used is identical to the 44 process run data set used above. In comparing the left side of the graph, showing the residual plot representing the new data without the expert knowledge, to the right side of the graph showing the residual plot representing the new data after the expert knowledge has been implemented by way of the desensitizing matrix, it is shown that the residual of the 44 sample set of data has been significantly reduced and the analysis significantly desensitized. The second data run is now within the model confidence limit. The model confidence limit is the same as horizontal dashed line 150 in FIG. 2, representing the data set on the PCA model projection.

Figure 4:
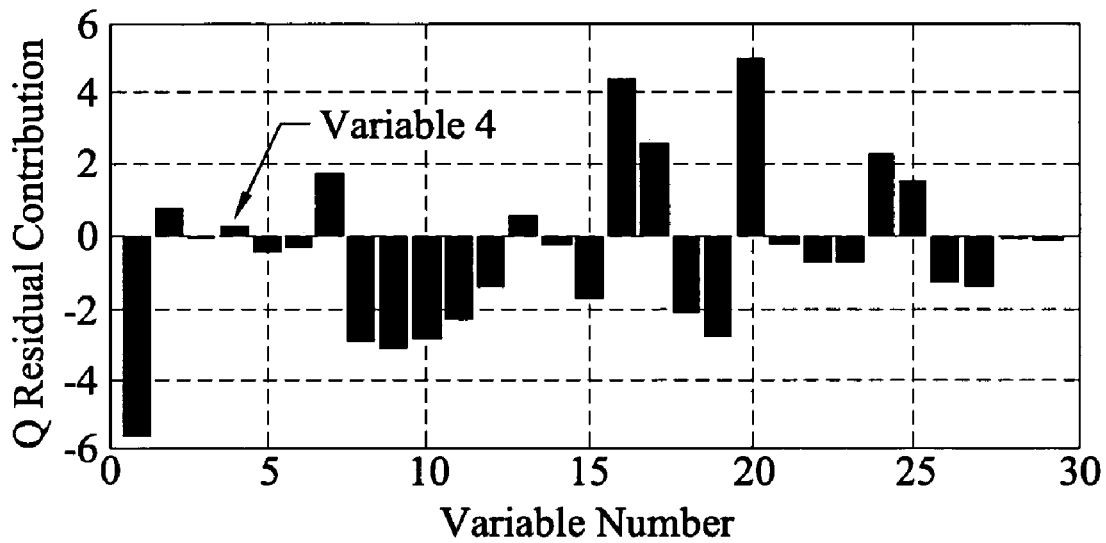
FIG. 4 provides a variable contribution plot, in accordance with one embodiment of the invention.

FIG. 4 provides a variable contribution plot, in accordance with one embodiment of the invention. The variable contribution plot in FIG. 4 represents the 44$^{th}$ sample accompanying the residual plot that results from running the method using the data set augmented with the desensitizing matrix, and then introducing a new data set identical to the 44 process run data set used initially. As shown in FIG. 4, variable four is no longer a high contributor. So the expert randomizer has conditioned the data set such that the variable four data that initially caused an outlier is now considered statistically normal.

The embodiment of the invention works more efficiently if the variable at issue, such as variable four above, does not have a strong correlation with the other variables in the process run. The correlation across the variables can be checked with the use of a correlation coefficient chart. A correlation coefficient chart is provided for the example discussed in FIGS. 2 and 3. Correlation coefficient charts can be generated with the application of PCA.

Figure 5:
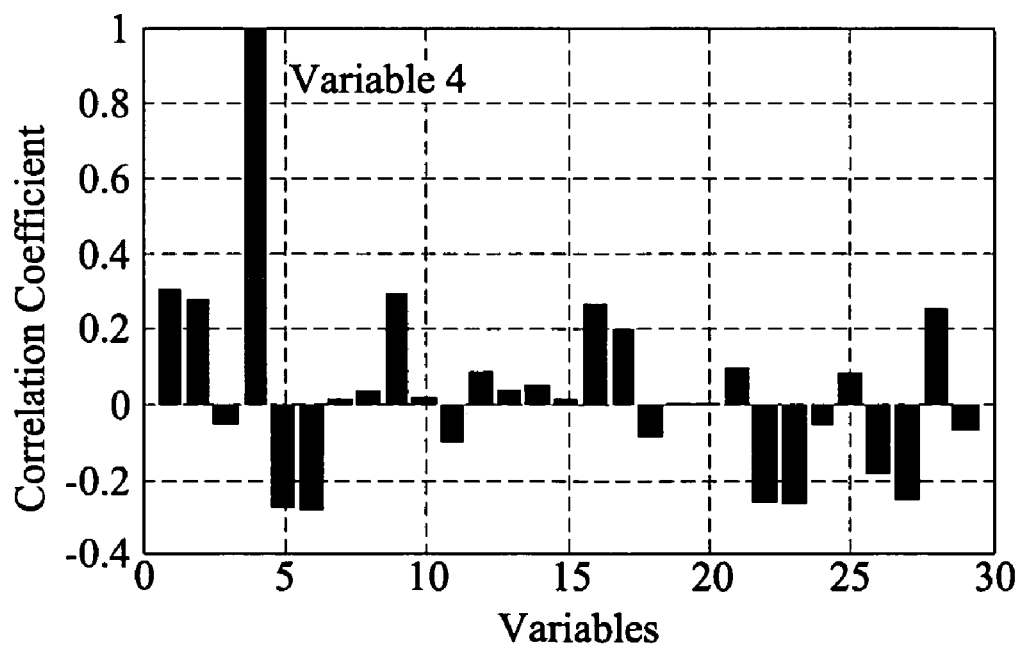
FIG. 5 provides a correlation coefficient chart, in accordance with one embodiment of the invention.

FIG. 5 provides a correlation coefficient chart, in accordance with one embodiment of the invention. As shown in FIG. 5, variable four is not strongly correlated with the other 28 variables in the process run for sample 44. If the correlation between variable four and other variables were strong, then the method might be more difficult to apply. When applying the expert randomizer to a variable of interest, if other variables are strongly correlated to the variable of interest they will also be desensitized, to some extent. So, if there are variables that are strongly correlated to a variable of interest and these variables should not be desensitized, the expert randomizer will be less effective. Therefore before the expert randomizer is applied to a new data set, it is valuable to review the correlation charts for how the variable of interest correlates with the remaining variables in a data set.

Exemplary code for an expert randomizer is provided in the following tables. In Table 1 below, the code provides for the case when the new data set is composed of one sample, i.e., one process run. Table 2 below provides for the case when the new data set is composed of multiple samples, i.e., more than one process run. Both Table 1 and Table 2 provide for the case when one or more variables is identified to be desensitized within a single process run of new data. The MATLAB® variable definitions are provided in the Notations section. Note that although MATLAB® is used, any appropriate software language to carry out the functionality could be used to create an expert randomizer.

TABLE 1

EXPERT RANDOMIZER MATLAB ROUTINE

Case1: Exemplary code for one sample of new data
ED=zeros(m,n); % assigning/initializing ED to be a matrix of zeros
of size m-by-n
    ED(1,:)=x; % assigning 1$^{st}$ row of ED as the new sample
    for j=1:kn % starts the loop for generating an expert data matrix

TABLE 1-continued

EXPERT RANDOMIZER MATLAB ROUTINE

```
        for each variable to be
desensitized
            NDR=randn(m-1,1); % generating a normally distributed
            random column-vector
            O=ones(m-1,1); % generating a column-vector of ones
            for computation
            r(:,j)=s(1,p(j))*NDR + x(mm,p(j))*O; % calculating the
            new value of the variable to
be desensitized based on expert knowledge
            if p(km,j)>1 % checking if the variable to be discarded
            is not the first variable in the
matrix
                for i=2:m % loop for replicating the samples
                    ED(i,1:p(j)-1)=x(mm,1:p(j)-1);
                    ED(i,p(j)+1:end)=x(mm,p(j)+1 :end);
                end
            elseif p(km,j)==1 % checking if the variable to be discarded
            is the first variable in
the matrix
                for i=2:m
                    ED(i,p(j)+1:end)=x(mm,p(j)+1:end); % assigning
                    the values of variables not
being desensitized
                end
            end
        end
        for pp=1:kn
            ED(2:m,p(pp))=r(:,pp); % assigning the values of
            variables being desensitized
        end
Data=[Data;ED]; % augmenting the original data matrix
to include the new matrix
```

Notations:
Data: matrix containing original data which is imported
m: number of samples in the original data
n: number of variables in the original data
x: matrix containing new data, which is imported
mm: number of samples in the new data having same number of variables (n)
p: index of variables that are determined as unimportant and have high contributions
kn: number of variables to discard that are not correlated strongly to other variables
km=1, number of rows for discarded vector
s: standard deviation of the variables in the original data, which is imported
NDR: normally distributed random vector of size m-by-1
O: vector of ones of size m-by-1
r: column vector that is being calculated based on expert knowledge
ED: Expert Data matrix

TABLE 2

EXPERT RANDOMIZER MATLAB ROUTINE

```
Case2: Exemplary code for any number of samples of new data.
ED=zeros(2*mm,nn); % assigning/initializing ED to be a
matrix of zeros of size m-by-n
    ED(1:mm,1:nn)=x; % assigning first row of ED
    as the new sample
    for j=1:kn % starts the loop for generating an expert data
    matrix for each variable to be
desensitized
        NDR=randn(mm,1); % generating a normally distributed
        random column-vector
        O=ones(mm,1); % generating a column-vector of ones
        for computation
        r(:,j)=s(1,p(j))*NDR + x(mm,p(j))*O; % calculating the
        new value of the variable to
be desensitized based on expert knowledge
        if p(km,j)>1 % checking if the variable to be discarded is not
        the first variable in the
matrix
            for i=mm+1:2*mm % loop for replicating the samples
                ED(i,1:p(j)-1)=x(i-mm,1:p(j)-1);
```

TABLE 2-continued

EXPERT RANDOMIZER MATLAB ROUTINE

```
                ED(i,p(j)+1:end)=x(i-mm,p(j)+1:end);
            end
        elseif p(km,j)==1% checking if the variable to be discarded
        is the first variable in the
matrix
            for i=mm+1:2*mm
                ED(i,p(j)+1:end)=x(i-mm,p(j)+1:end); %
                assigning the values of variables not
being desensitized
            end
        end
    end
    for pp=1:kn
        ED(mm+1:2*mm,p(pp))=r(:,pp); % assigning the values of
        variables being
desensitized
    end
Data=[Data;ED]; % augmenting the original data
matrix to include the new matrix
```

Notations:
Data: matrix containing original data, which is imported
m: number of samples in the original data
n: number of variables in the original data
x: matrix containing new data
mm: number of samples in the new data having same number of variables (n)
p: index of variables that are determined as unimportant and have high contributions
kn: number of variables to discard that are not correlated strongly to other variables
km=1, number of rows for discarded vector
s: standard deviation of the variables in the original data, which is imported
NDR: normally distributed random vector of size m-by-1
O: vector of ones of size m-by-1
r: column vector that is being calculated based on expert engineer knowledge
ED: Expert Data matrix Provided below is an example describing the execution of the Expert Randomizer MATLAB Routine provided in Table 1. In this example the new data set includes one sample (i.e., process run). Only one variable will be desensitized in this example. The example is generalized to provide and overall understanding of operation steps performed in the Expert Randoinizer MATLAB Routine provided in Table 1. The example may not include a description of every operation of the code.

Step 1

Certain MATLAB® variables are assigned values by importing data. (initializations not all shown in code). Data is the MATLAB® variable containing the original data for the wafer process system. The values of the original data are already known based on previous runs for the same process on the same equipment. The original data is imported into MATLAB® for use in the calculations. In this example the value for Data follows:

Data =

| | Column 1 | 2 | 3 |
|---|---|---|---|
| Row 1 | 10.0 | 200.0 | 3.2 |
| Row 2 | 10.1 | 200.1 | 3.2 |
| Row 3 | 9.8 | 199.8 | 3.1 |
| Row 4 | 10.0 | 200.2 | 3.1 |

Data is represented by a matrix of m (=4) rows and n (=3) columns. Each column represents a variable in the wafer processing system (i.e., there are 3 variables in this example). Each row represents a sample (i.e., process run).

Step 2

The new data is represented by the MATLAB® variable x. The new data must contain the same number of variables (n=3) as the original data. The new data is imported into MATLAB® and initialized. For this example the value for each variable/column for the new data is:

x=10 200 3

Before the Expert Randomizer is initiated it is assumed that x has been determined to be an outlier (when compared to the original data, 'Data'). Also, for this example the third variable has been assumed to be a high contributor and has been labeled as unimportant based on engineering knowledge.

Step 3

ED is initialized having the same size as the Data matrix (step 1), where each element is assigned a value of 0.

ED=zeros(m,n)

For this step the value for ED is:

$$ED = \begin{matrix} 0 & 0 & 0 \\ 0 & 0 & 0 \\ 0 & 0 & 0 \\ 0 & 0 & 0 \end{matrix}$$

Step 4

The first row of ED is assigned the values from the new sample, x

For this step the value for ED is:

$$ED = \begin{matrix} 10 & 200 & 3 \\ 0 & 0 & 0 \\ 0 & 0 & 0 \\ 0 & 0 & 0 \end{matrix}$$

Step 5

The standard deviation for Data is calculated. This standard deviation will be used to generate the expert randomizer.

s=std(Data)

std is a MATLAB® command that calculates the standard deviation of a matrix.

So, the value for s is shown below:

s=0.13 0.17 0.06

Each number in the s vector denotes the standard deviation for a variable in the Data matrix.

Step 6

Next, a normally distributed random vector with 3 rows is generated.

NDR=randn(3,1), where randn is a standard MATLAB® command that generates random data.

The value for NDR is shown below:

$$NDR = \begin{matrix} 0.7119 \\ 1.2902 \\ 0.6686 \end{matrix}$$

Step 7

A vector labeled O is generated. The O vector contains ones and has the same number of rows as NDR. This vector is used to facilitate with the matrix computations.

O=ones(3,1), where 'ones' is a standard MATLAB® command

The value for O is shown below:

$$O = \begin{matrix} 1 \\ 1 \\ 1 \end{matrix}$$

Step 8

In this step the standard deviation of the third variable from Data (i.e., s(1,3)) is multiplied by NDR. The resulting value is added to the value for the third variable from the new data (x(1,3)).

r=s(1,3)*NDR+x(1,3)*O

This provides:

$$r = \begin{matrix} 3.0411 \\ 3.0745 \\ 3.0386 \end{matrix}$$

Step 9

Multiple copies of the new data, which is not being desensitized, are made and assigned to the second, third and fourth rows of the ED matrix $$ED = \begin{matrix} 10 & 200 & 3 \\ 10 & 200 & 0 \\ 10 & 200 & 0 \\ 10 & 200 & 0 \end{matrix}$$

Step 10

The value for r is assigned to rows 2 through 4 of the third column of the ED matrix.

ED (2:4,3)=r

Therefore, $$ED = \begin{matrix} 10 & 200 & 3.0000 \\ 10 & 200 & 3.0411 \\ 10 & 200 & 3.0745 \\ 10 & 200 & 3.0386 \end{matrix}$$

Step 11

Finally, ED is augmented to the Data matrix. This new matrix replaces Data.

Data=[Data;ED]

Therefore, $$\text{Data} = \begin{matrix} 10.0 & 200.0 & 3.2000 \\ 10.1 & 200.1 & 3.2000 \\ 9.8 & 199.8 & 3.1000 \\ 10.0 & 200.2 & 3.1000 \\ 10.0 & 200.0 & 3.0000 \\ 10.0 & 200.0 & 3.0411 \\ 10.0 & 200.0 & 3.0745 \\ 10.0 & 200.0 & 3.0386 \end{matrix}$$

As described, the Expert Randomizer provides a method for adjusting a new data set, which has met the outlier, high contribution, and expert knowledge criteria discussed above to then normalize the new data with respect to the original data set. The normalized data is then augmented to the original data set. So, the augmented data will have been desensitized to the variable data which initially caused an outlier.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer, readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in FIG. 1 are not required to be performed in the order illustrated, and that all the processing represented by the operations may not be necessary to practice the invention. Further, the processes described in FIG. 1 can also be implemented in software stored in any one of or combinations of the RAM, the ROM, or the hard disk drive.

In summary, the embodiments of the present invention provide a method for incorporating expert knowledge for the identification of unimportant out-of-statistical-control signals in wafer processing systems. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims and equivalents thereof.

The invention claimed is:

1. A method for adjusting a data set defining a set of process runs, each process run having a set of data corresponding to a set of variables for a wafer processing operation, comprising:

receiving a model derived from a data set;

performing a new process run using a wafer processing system, the new process run generating a new data set corresponding to variables collected in the course of the new process run;

receiving the new data set corresponding to the new process run;

projecting the new data set to the model;

identifying an outlier data point produced as a result of the projecting, the outlier data point corresponding to the new data set;

identifying a variable corresponding to the one outlier data point, the identified variable exhibiting a high contribution;

identifying a value for the variable from the new data set;

determining whether the value for the variable is unimportant;

when the value for the variable is unimportant, updating the data set with a normalized matrix of data, the normalized matrix of data being created using random data and the variable that was determined to be unimportant from each of the new data set and the data set; and when the value for the variable is not unimportant, declaring a fault and halting the performing of the new process run.

2. The method of claim 1, further comprising;

receiving a second model derived from the updated data set.

3. The method of claim 2, further comprising;

receiving the new data set; and projecting the new data set to the second model.

4. The method of claim 3, further comprising;

determining whether the outlier data point remains as an outlier.

5. The method of claim 1, wherein the set of variables include at least one or more variables representing a chamber pressure, a chamber temperature, a delivered power to at least one electrode, an electrostatic chuck clamping voltage, at least one gas flow rate, a recordable process variable, a change in a process parameter, and a change in a software setting process parameter.

6. The method of claim 1, wherein determining whether the value for the variable is unimportant is performed with expert knowledge.

7. The method of claim 6, wherein expert knowledge is knowledge of behavior of the variable.

8. The method of claim 1, wherein the value for the variable is unimportant if the value would not necessitate calling a fault in the wafer processing operation.

9. The method of claim 1, further comprising;
determining whether the variable is strongly correlated with a remaining variable from the set of variables after determining whether the value for the variable is unimportant.

10. A method for adjusting a data set defining a set of process runs, each process run having a set of data corresponding to a set of variables for a wafer processing operation, comprising:
   (a) receiving a model derived from a data set;
   (b) receiving a new data set generated by a new process run on a wafer processing system, the new data set corresponding to the set of variables, the set of variables being collected in the course of the new process run;
   (c) projecting the new data set to the model;
   (d) identifying outlier data points produced as a result of the projecting;
   (e) identifying one of the outlier data points from the outlier data points;
   (f) identifying a variable corresponding to the one outlier data point, the identified variable exhibiting a high contribution;
   (g) determining whether the variable is unimportant;
   (h) when the variable is unimportant, updating the data set with a normalized matrix of data, the normalized matrix of data being created using data from the new data set and from the data set, the normalized matrix of data being created using the variable that was determined to be non-important from each of the new data and the data set; and
   (i) when the value for the variable is not unimportant, declaring a fault and halting the new process run.

11. The method of claim 10, further comprising;
performing steps (e)-(i) once for each of the outlier data points.

12. The method of claim 10, wherein determining whether the variable is unimportant is performed with expert knowledge.

13. The method of claim 10, wherein expert knowledge includes knowledge of behavior of the variable.

* * * * *